(12) United States Patent
Mehta et al.

(10) Patent No.: US 11,688,634 B2
(45) Date of Patent: Jun. 27, 2023

(54) TRENCHES IN WAFER LEVEL PACKAGES FOR IMPROVEMENTS IN WARPAGE RELIABILITY AND THERMALS

(71) Applicant: Intel Corporation, Santa Clara, CA (US)

(72) Inventors: Vipul Mehta, Chandler, AZ (US); Yiqun Bai, Chandler, AZ (US); Ziyin Lin, Chandler, AZ (US); John Decker, Tempe, AZ (US); Yan Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 818 days.

(21) Appl. No.: 16/526,012

(22) Filed: Jul. 30, 2019

(65) Prior Publication Data

US 2021/0035859 A1 Feb. 4, 2021

(51) Int. Cl.
| | |
|---|---|
| *H01L 21/56* | (2006.01) |
| *H01L 23/31* | (2006.01) |
| *H01L 21/768* | (2006.01) |
| *H01L 23/373* | (2006.01) |
| *H01L 23/367* | (2006.01) |

(52) U.S. Cl.
CPC ...... *H01L 21/76877* (2013.01); *H01L 21/565* (2013.01); *H01L 21/76804* (2013.01); *H01L 23/3107* (2013.01); *H01L 23/367* (2013.01); *H01L 23/373* (2013.01)

(58) Field of Classification Search
CPC ............. H01L 21/76877; H01L 21/565; H01L 21/76804; H01L 23/3107; H01L 23/367; H01L 23/373; H01L 23/3128; H01L 2224/73253; H01L 21/56; H01L 21/563; H01L 21/561; H01L 23/3135; H01L 23/562; H01L 2224/16225; H01L 2224/32225; H01L 2224/73204
See application file for complete search history.

(56) References Cited

U.S. PATENT DOCUMENTS

| | | | |
|---|---|---|---|
| 2013/0187258 A1* | 7/2013 | Lu | H01L 24/97 257/621 |
| 2015/0048503 A1* | 2/2015 | Chiu | H01L 24/97 438/126 |

* cited by examiner

*Primary Examiner* — Kyoung Lee
(74) *Attorney, Agent, or Firm* — Schwabe, Williamson & Wyatt, P.C.

(57) ABSTRACT

Embodiments disclosed herein include composite dies and methods of forming such composite dies. In an embodiment, a composite die comprises a base substrate, a first die over the base substrate, and a second die over the base substrate and adjacent to the first die. In an embodiment an underfill layer is between the first die and the base substrate, between the second die and the base substrate, and between the first die and the second die. In an embodiment, a trench into the underfill layer is between the first die and the second die. In an embodiment the composite die further comprises, a mold layer over the first die and the second die, wherein the mold layer fills the trench.

27 Claims, 10 Drawing Sheets

TRENCHES IN WAFER LEVEL PACKAGES FOR IMPROVEMENTS IN WARPAGE RELIABILITY AND THERMALS

TECHNICAL FIELD

Embodiments of the present disclosure relate to semiconductor devices, and more particularly to trenches in a composite die for improving warpage and thermal performance.

BACKGROUND

Advances in computing performance and reductions in form factor have led to the proliferation of composite dies. Composite dies include a plurality of dies that are packaged together using underfill (e.g., capillary underfill (CUF), non-conductive paste (NCP), non-conductive film (NCF), etc.) and mold layers. However, the use of CUF in such composite dies leads to significant assembly challenges. For example, prior to singulating individual composite dies, the wafer level package exhibits significant warpage. After singulation, warpage in the composite die impacts chip attach yield and package reliability.

Warpage is significant in part due to the high coefficient of thermal expansion (CTE) of the underfill. However, material reformulations to the underfill are limited and may result in improvements in warpage of only approximately 20% or less. Alternatively, additives (e.g., low stress agents) may be added to the mold layer. Unfortunately, the additives result in a decrease in the adhesion strength and toughness of the mold layer, which negatively impacts reliability. Another option to improve warpage is to use wafer flattening processes. While wafer flattening can improve warpage, it is a temporary solution, and the wafer flattening needs to be repeated frequently during wafer level assembly. Moreover, wafer flattening cannot be used to address warpage of singulated composite dies.

EMBODIMENTS OF THE PRESENT DISCLOSURE

Described herein are electronic packages with composite dies that have a trench to improve warpage and thermal performance and methods of forming such packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, warpage during wafer level packaging assembly and warpage of singulated composite dies leads to significant assembly and reliability issues. The warpage is in part due to the mechanical coupling between the dies in a wafer level assembly with a high coefficient of thermal expansion (CTE) underfill material. Accordingly, embodiments disclosed herein include trenches into the underfill that reduces the stresses in the wafer level assembly. In embodiments disclosed herein, the trenches are filled with a lower CTE material. For example, trenches may be formed between each of the dies in the wafer level assembly and the trenches are filled with the mold layer. Such features reduce the warpage at the wafer level and improves the warpage of the singulated composite dies as well.

In addition to improving the warpage, embodiments disclosed herein also provide improved thermal-mechanical reliability and thermal performance. With respect to thermal-mechanical reliability, the presence of the trenches between dies reduces the stress along an interface between the sidewall surface of the die and the underfill. As such, delamination and/or cracking failures are mitigated. With respect to thermal performance, the trenches (filled with mold material) provide a low thermal resistance path between a heat spreader and a base substrate of the composite die since the mold material has a lower thermal resistance compared to the underfill material. This is particularly beneficial when the base substrate is an active die which generates substantial heat.

Figure 1A:
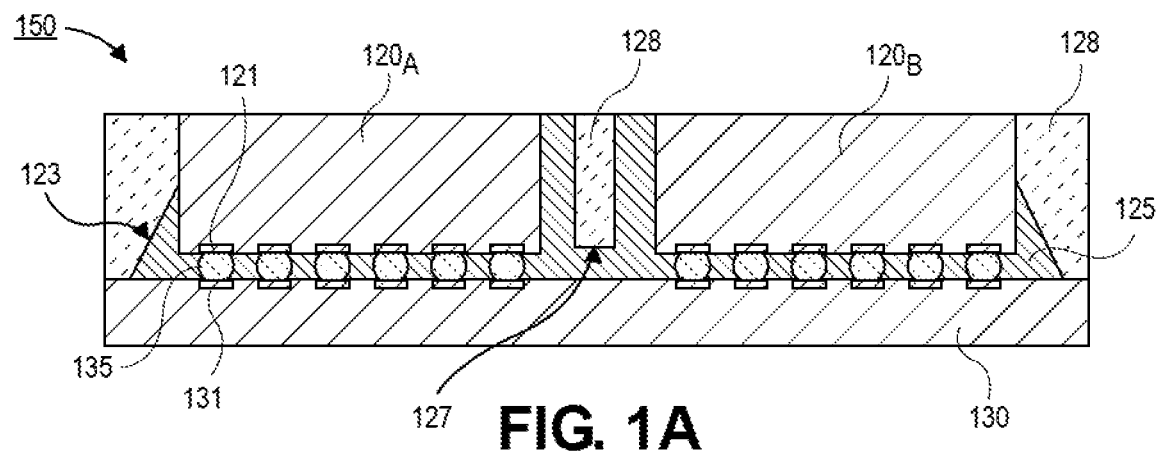
FIG. 1A is a cross-sectional illustration of a composite die with a trench into the underfill between a first die and a second die, in accordance with an embodiment.

Referring now to FIG. 1A, a cross-sectional illustration of a composite die 150 is shown, in accordance with an embodiment. In an embodiment, the composite die 150 may comprise a base substrate 130 and a plurality of dies 120 over the base substrate 130. The base substrate 130 may be a semiconductor, such as silicon or the like. In other embodiments, the base substrate 130 may comprise glass or any other suitable substrate that allows high density interconnects between the plurality of dies 120. In some embodiments, the base substrate 130 is a passive substrate. That is, the base substrate 130 may comprise no transistors or other active circuitry components. In other embodiments, the base substrate 130 may be an active die. That is, the base substrate 130 may comprise active components, such as transistors or the like. In an embodiment, through substrate vias (not shown) may pass through the base substrate 130.

In an embodiment, a plurality of dies 120 are shown as comprising a first die $120_A$ and a second die $120_B$. However, it is to be appreciated that the plurality of dies 120 may comprise two or more dies 120. In an embodiment, the plurality of dies 120 may be positioned adjacent to each other in a side-by-side configuration. The first die $120_A$ and the second die $120_B$ may be electrically coupled to the base substrate 130 by interconnects 135. In an embodiment, the interconnects 135 may comprise bumps (e.g., solder bumps, copper bumps, or the like). The interconnects 135 may provide an electrical pathway between die pads 121 on each die 120 and base substrate pads 131 on the base substrate 130.

In an embodiment, the plurality of dies 120 may comprise any type of die. For example, the plurality of dies 120 may comprise processor dies, graphics dies, memory dies, or the like. In some embodiments, the first die $120_A$ may be substantially similar to the second die $120_B$. In other embodiments, the first die $120_A$ may be a different type of die than the second die $120_B$.

In an embodiment, an underfill 125 may surround the interconnects 135 and fill spaces between the first die $120_A$ and the second die $120_B$. The underfill 125 may be any suitable underfill material. For example, the underfill 125 may comprise a capillary underfill (CUF) material, a non-conductive paste (NCP) material, a non-conductive film (NCF) material, or the like.

In an embodiment, a trench 127 is formed into the underfill 125 between the first die $120_A$ and the second die $120_B$. The trench 127 may be filled with a mold layer 128. The mold layer 128 may also surround the edges of the plurality of dies $120_A$ and $120_B$. Filling the trench 127 with the mold layer 128 allows for the material properties between the dies $120_A$ and $120_B$ to be altered in order to provide reductions in warpage, improved reliability, and/or improved thermal performance.

In an embodiment, the mold layer 128 has a CTE that is lower than a CTE of the underfill 125. For example, the CTE of the underfill may be approximately 30 ppm/K and the CTE of the mold layer 128 may be less than approximately 15 ppm/K. In an embodiment, the CTE of the mold layer 128 may be between approximately 5 ppm/K and 10 ppm/K. In an embodiment, the mold layer 128 may also include an elastic modulus that is lower than an elastic modulus of the underfill 125. For example, the elastic modulus of the mold layer 128 may be less than 15 GPa, or less than 10 GPa. In some embodiments, a thermal conductivity of the mold layer 128 may be greater than a thermal conductivity of the underfill 125. For example, the thermal conductivity of the mold layer 128 may be approximately 2 W/mK or greater, and the thermal conductivity of the underfill 125 may be approximately 1 W/mK or less. In a particular embodiment, the thermal conductivity of the mold layer 128 may be between approximately 2.5 W/mK and 3 W/mK.

In an embodiment, the trench 127 is formed into the underfill 125 with any suitable process. For example, the trench 127 may be formed with a laser ablation process. Particularly, the patterning process used to form the trench 127 may provide a profile that is distinct from the fillet profile that naturally results from the deposition of the underfill 125. For example, fillets 123 along the outer surfaces of the dies $120_A$ and $120_B$ are sloping and curved, whereas the profile of the trench 127 is substantially vertical.

Figure 1B:
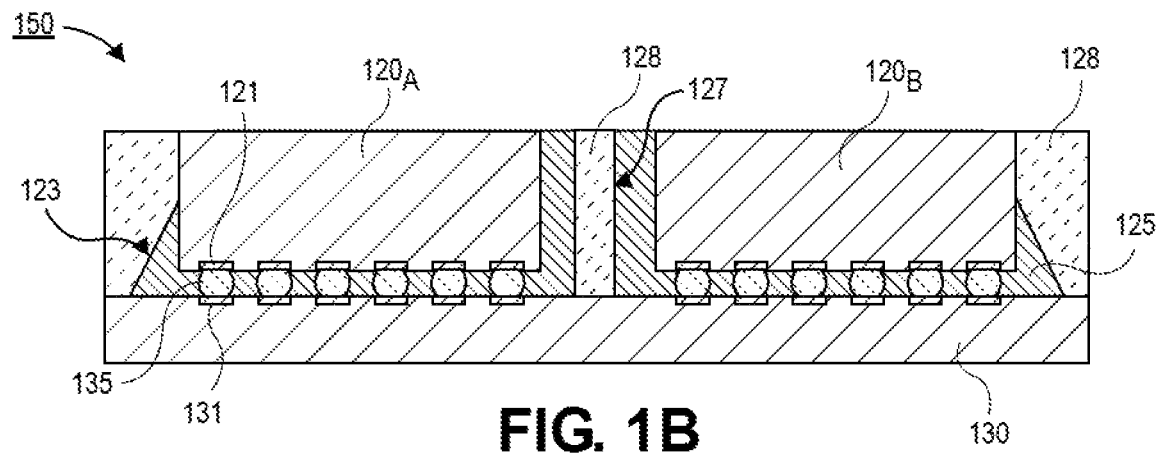
FIG. 1B is a cross-sectional illustration of a composite die with a trench entirely through the underfill between a first die and a second die, in accordance with an embodiment.

In the illustrated embodiment, the trench 127 extends into the underfill 125 a distance that is less than the thickness of the dies $120_A$ and $120_B$. However, it is to be appreciated that embodiments are not limited to such configurations. For example, in FIG. 1B, the trench 127 is shown as extending entirely through the underfill 125. In other embodiments, the trench 127 may extend past the bottom surface of the dies $120_A$ and $120_B$, but not all the way through the underfill 125.

Figure 1C:
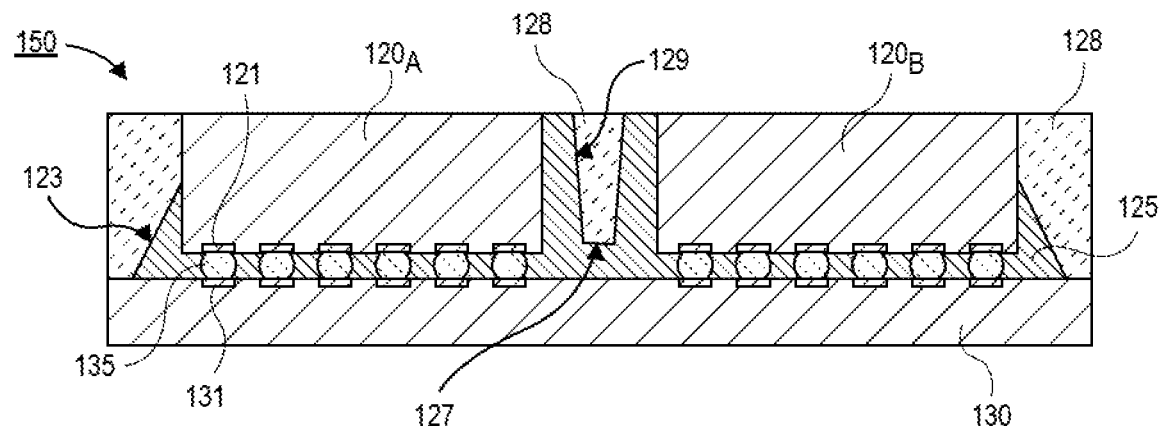
FIG. 1C is a cross-sectional illustration of a composite die with a trench into the underfill between a first die and a second die where the trench has a tapered profile, in accordance with an embodiment.

Referring now to FIG. 1C, a cross-sectional illustration of a composite die 150 is shown, in accordance with another embodiment. In an embodiment, the composite die 150 may be substantially similar to the composite die 150 in FIG. 1A, with the exception that the trench 127 has a different profile 129. For example, the trench 127 in FIG. 1C may have a substantially tapered profile 129. The tapered profile 129 is distinct from the profile of the naturally occurring fillets 123. Particularly, the taper of the fillets 123 begins at a sidewall surface of the dies 120, whereas the tapered profile 129 begins at a top surface of the underfill 125. That is, the tapered profile 129 is set away from the vertical edges of the dies 120. Furthermore, the tapered profile 129 of the trench 127 may terminate at a flat surface that is above a bottom surface of the underfill 125. In contrast, the fillets 123 terminate at the bottom surface of the underfill 125 that is substantially coplanar with a top surface of the base substrate 130. In an embodiment, the tapered profile 129 of the trench 127 may be characteristic of a profile formed by a laser drilling process.

Figure 1D:
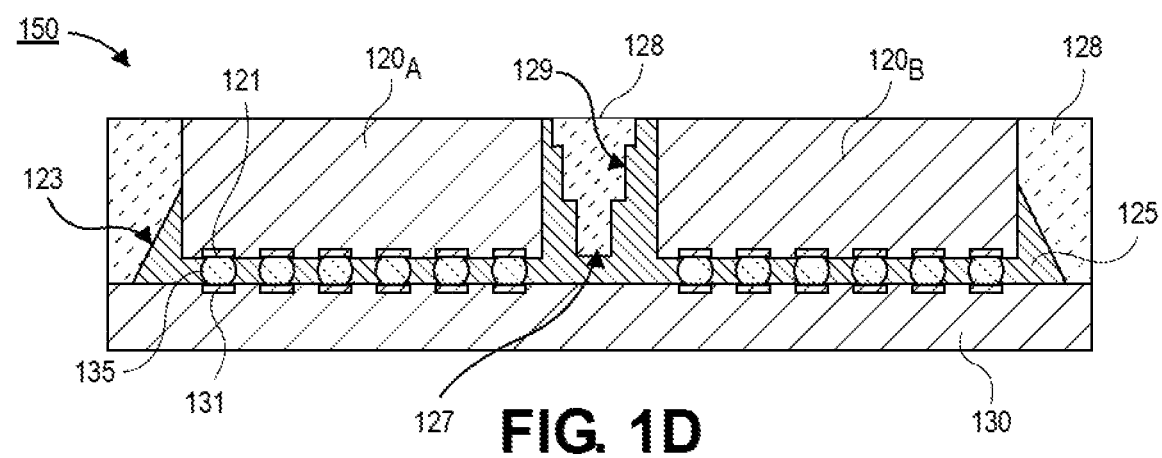
FIG. 1D is a cross-sectional illustration of a composite die with a trench into the underfill between a first die and a second die where the trench has a stepped profile, in accordance with an embodiment.

Referring now to FIG. 1D, a cross-sectional illustration of a composite die 150 is shown, in accordance with another embodiment. In an embodiment, the composite die 150 may be substantially similar to the composite die 150 in FIG. 1A, with the exception that the trench 127 has a different profile 129. For example, the profile 129 may be described as a "stepped profile". A stepped profile may comprise a plurality of alternating rise surfaces (i.e., vertical surfaces) and run surfaces (i.e., horizontal surfaces), similar to the architecture of a staircase.

Figure 2A:
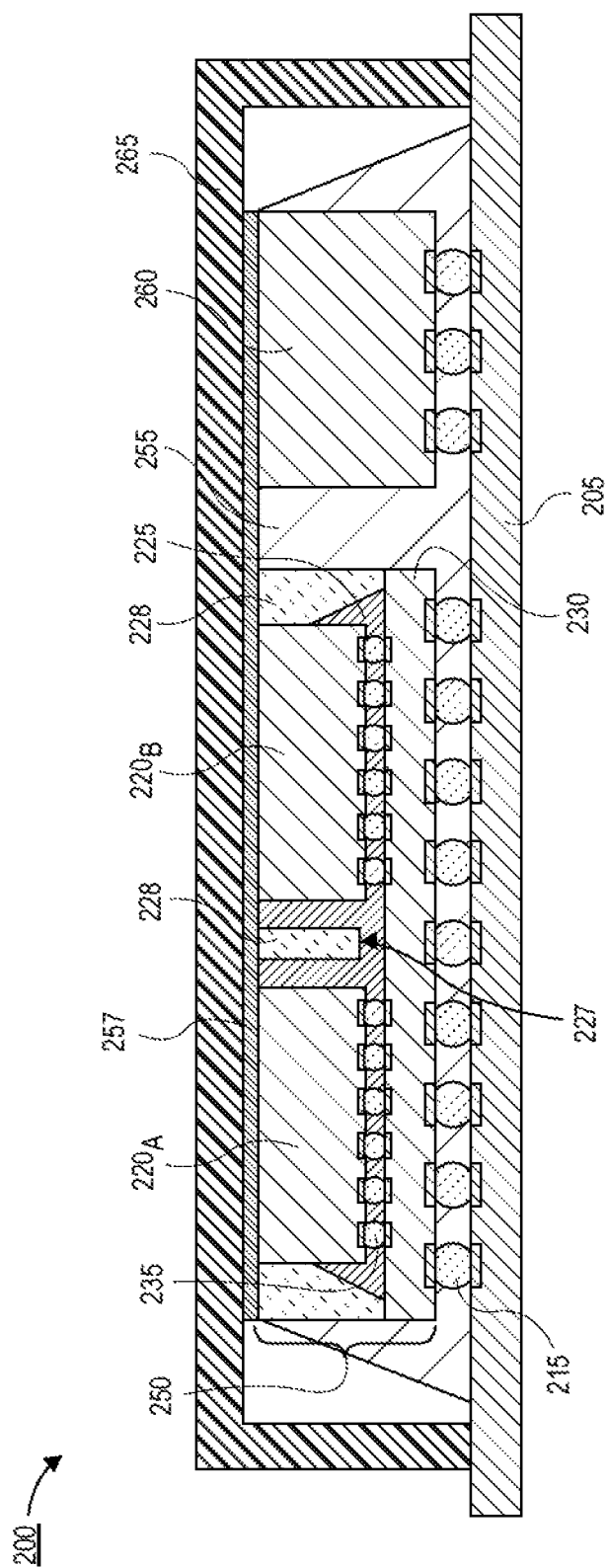
FIG. 2A is a cross-sectional illustration of an electronic package that comprises a composite die with a trench into the underfill between a first die and a second die, in accordance with an embodiment.

Referring now to FIG. 2A, a cross-sectional illustration of an electronic package 200 is shown, in accordance with an embodiment. In an embodiment, the electronic package 200 may comprise a package substrate 205. The package substrate 205 may comprise a plurality of dielectric layers (e.g., laminated layers). Conductive features (e.g., traces, vias, pads, etc.) may be embedded in the package substrate 205. In some embodiments, interposers, bridges, or the like may also be embedded in the package substrate 205.

In an embodiment, a composite die 250 may be electrically coupled to the package substrate 205 by interconnects 215. In the illustrated embodiment, the interconnects 215 are shown as solder bumps, but it is to be appreciated that embodiments may include any interconnect architecture between the composite die 250 and the package substrate 205. In an embodiment, the composite die 250 may be substantially similar to the composite dies 150 described above with respect to FIGS. 1A-1D. For example, the composite die 250 may comprise a base substrate 230, a plurality of dies $220_A$ and $220_B$ electrically coupled to the base substrate 230 by interconnects 235, an underfill 225, and a mold layer 228. In a particular embodiment, the composite die 250 may further comprise a trench 227 that extends into the underfill 225 between the first die $220_A$ and the second die $220_B$.

In an embodiment, the electronic package 200 may also comprise an integrated heat spreader (IHS) 265. The IHS 265 may be a high thermal conductivity material. In an embodiment, the IHS 265 may be thermally coupled to a heat sink (not shown). The IHS 265 may be thermally coupled to the composite die 250. For example, a thermal interface material (TIM) 257 may be positioned between a bottom surface of the IHS 265 and a top surface of the composite die 250. In a particular embodiment, the TIM 257 may be in direct contact with surfaces of the dies $220_A$ and $220_B$, a portion of the underfill 225, and a portion of the mold layer 228.

In an embodiment, the electronic package 200 may also comprise additional components. For example, the electronic package 200 may comprise passives, such as capacitors, or the like. In other embodiments, the electronic package 200 may comprise one or more additional dies 260 electrically coupled to the package substrate 205. For example, a companion die 260 may be positioned adjacent to the composite die 250. The companion die 260 may also be thermally coupled to the IHS 265 by a TIM 257. In an embodiment, the composite die 250 and the companion die 260 may also be embedded in a second underfill 255. The second underfill may extend between sidewall surfaces of the composite die 250 and the companion die 260 in addition to surrounding the interconnects 215 between the composite die 250 and the package substrate 205, and between the companion die 260 and the package substrate 205.

Figure 2B:
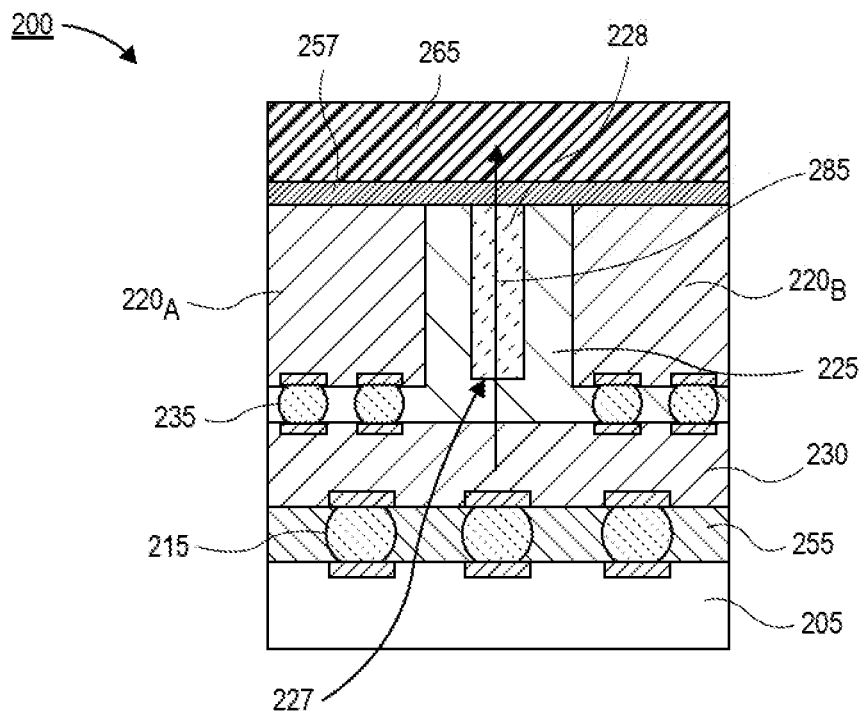
FIG. 2B is a zoomed in portion of the electronic package in FIG. 2A that illustrates a low thermal resistance path between a base substrate and a heat spreader, in accordance with an embodiment.
Figure 2C:
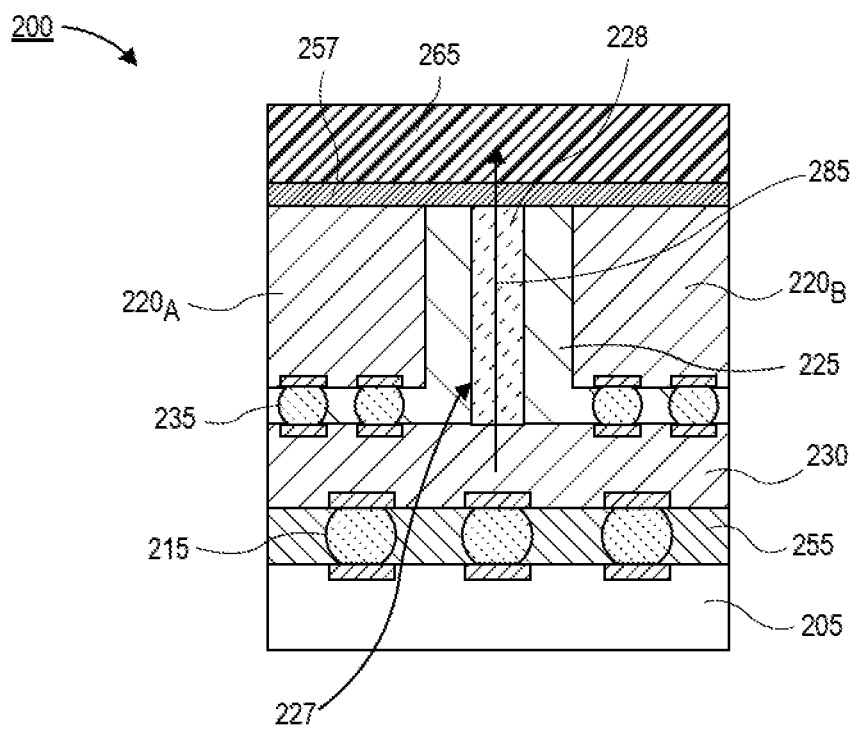
FIG. 2C is a zoomed in portion of an electronic package that illustrates a low thermal resistance path between a base substrate and a heat spreader, in accordance with an additional embodiment.

Referring now to FIG. 2B, a cross-sectional illustration of a portion of the electronic package 200 is shown, in accordance with an embodiment. The portion of the electronic package 200 that is depicted more clearly illustrates a low thermal resistance path 285 from the base substrate 230 to the IHS 265. Particularly, since the mold layer 228 fills the trench 227, the low thermal resistance path 285 extends up between the dies $220_A$ and $220_B$ along the trench 227. Instead of needing to pass through the entire thickness of the low thermal conductivity underfill 225, the thermal path 285 only needs to pass through a portion of the underfill 225 below the trench 227. Accordingly, increasing the depth of the trench 227 reduces the thermal resistance of thermal path 285. For example, as shown in FIG. 2C, the thermal resistance of thermal path 285 is minimized by extending the trench 227 all the way through the underfill 225. In such embodiments, the low resistance thermal path 285 does not need to traverse any portion of the underfill 225.

Referring now to FIGS. 3A-3G, a series of cross-sectional and plan view illustrations depict a process for assembling a composite die 350 using wafer level assembly processes is shown, in accordance with an embodiment. In FIGS. 3A-3G the interconnects (e.g., solder bumps, copper bumps, pads, etc.) are omitted for clarity. However, it is to be appreciated that interconnects between the dies 320 and the base substrate 330 may be substantially similar to those described above.

Figure 3A:
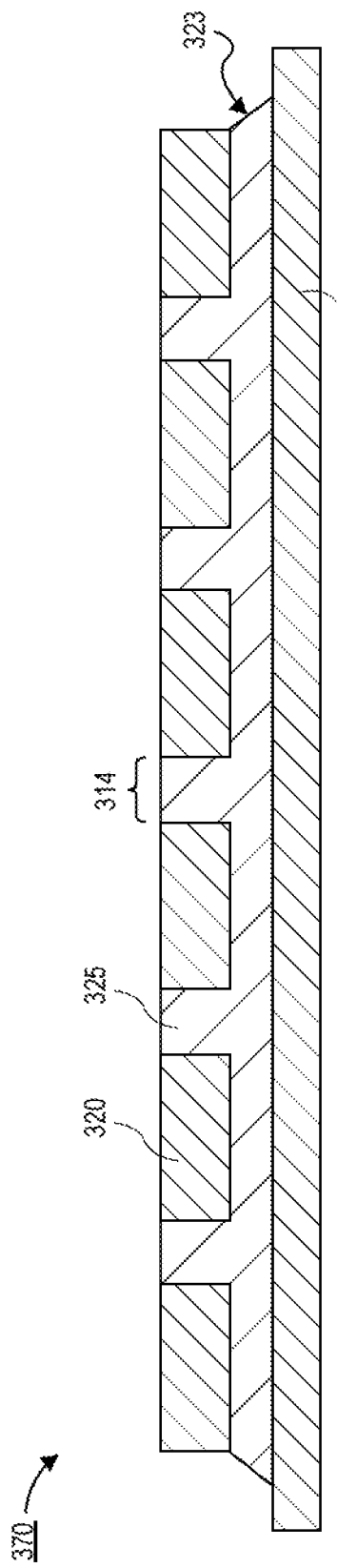
FIG. 3A is a cross-sectional illustration of a wafer level assembly that comprises a base substrate and a plurality of dies over the base substrate, in accordance with an embodiment.

Referring now to FIG. 3A, a cross-sectional illustration of a wafer level assembly 370 is shown, in accordance with an embodiment. In an embodiment, the wafer level assembly 370 may comprise a base substrate 330. The base substrate 330 may be any suitable substrate on which high density interconnects may be fabricated. For example, the base substrate 330 may comprise a semiconductor material (e.g., silicon), glass, or the like. In an embodiment, the base substrate 330 may be an active substrate or a passive substrate. The base substrate 330 may be sized to receive a plurality of dies 320. That is, the base substrate 330 may be used to assemble a plurality of composite dies. As such, any needed circuitry, components, or the like needed for each composite die may be repeated a plurality of times across the base substrate 330.

In an embodiment, a plurality of dies 320 may be attached to the base substrate 330. For example, the plurality of dies 320 may be attached to the base substrate 330 using interconnects (not shown) such as those described above. The plurality of dies 320 may be arranged adjacent to each other. That is, the plurality of dies 320 may be arranged in a side-by-side configuration. Accordingly, embodiments include a plurality of gaps 314 between sidewall surfaces of the plurality of dies 320.

In an embodiment, an underfill 325 may be dispensed under and around the plurality of dies 320. The underfill 325 may be any suitable underfill material, such as CUF, NCP, or NCF. In an embodiment, the underfill 325 substantially fills the gaps 314 between the sidewall surfaces of the plurality of dies 320. As shown, the interior dies 320 may have all sidewall surfaces covered by the underfill 325, and the exterior dies 320 may have only portions of the sidewall surfaces covered by the underfill 325. For example, fillets 323 may be present along outward facing surfaces of the exterior dies 320.

Figure 3B:
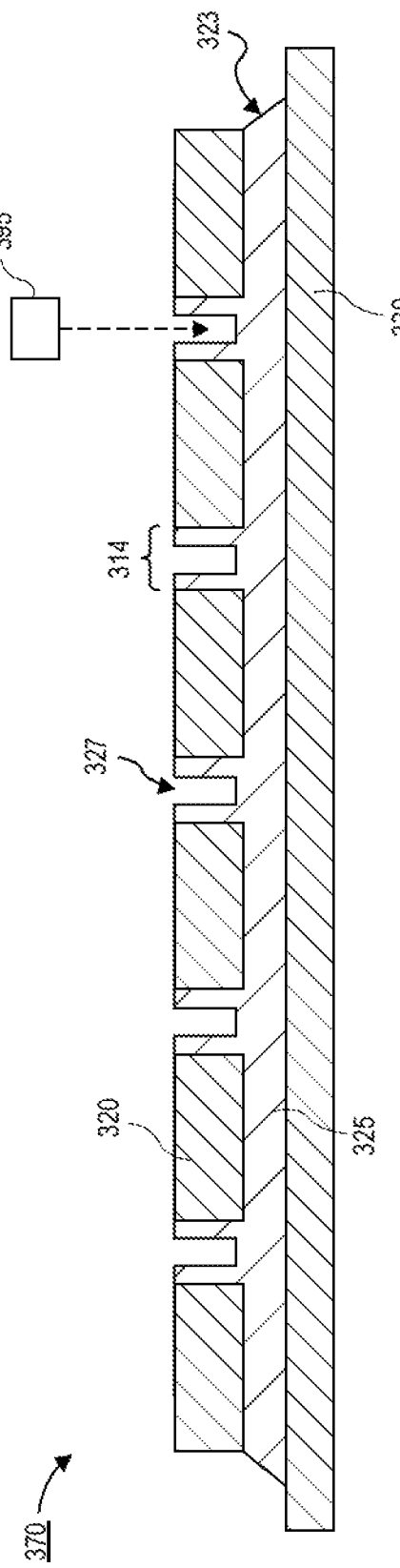
FIG. 3B is a cross-sectional illustration of the wafer level assembly after a trenches are formed into an underfill between the plurality of dies, in accordance with an embodiment.

Referring now to FIG. 3B, a cross-sectional illustration of the wafer level assembly 370 after a plurality of trenches 327 are formed into the underfill 325 is shown, in accordance with an embodiment. In an embodiment, the trenches 327 may be formed with any suitable patterning process. In a particular embodiment, the trenches 327 are formed with a laser 395 using a laser ablation process. The patterning process generates trenches 327 that have profiles that are distinguishable from the profile of the fillets 323. In the illustrated embodiment, the profile of the trenches 327 is shown as being substantially vertical. However, it is to be appreciated that the trenches 327 may have any profile in accordance with embodiments described above, such as tapered profiles, stepped profiles, or the like. In an embodiment, the trenches 327 may be patterned after the underfill 325 is cured. In other embodiments, the trenches 327 may be patterned before the underfill 325 is cured.

Figure 3C:
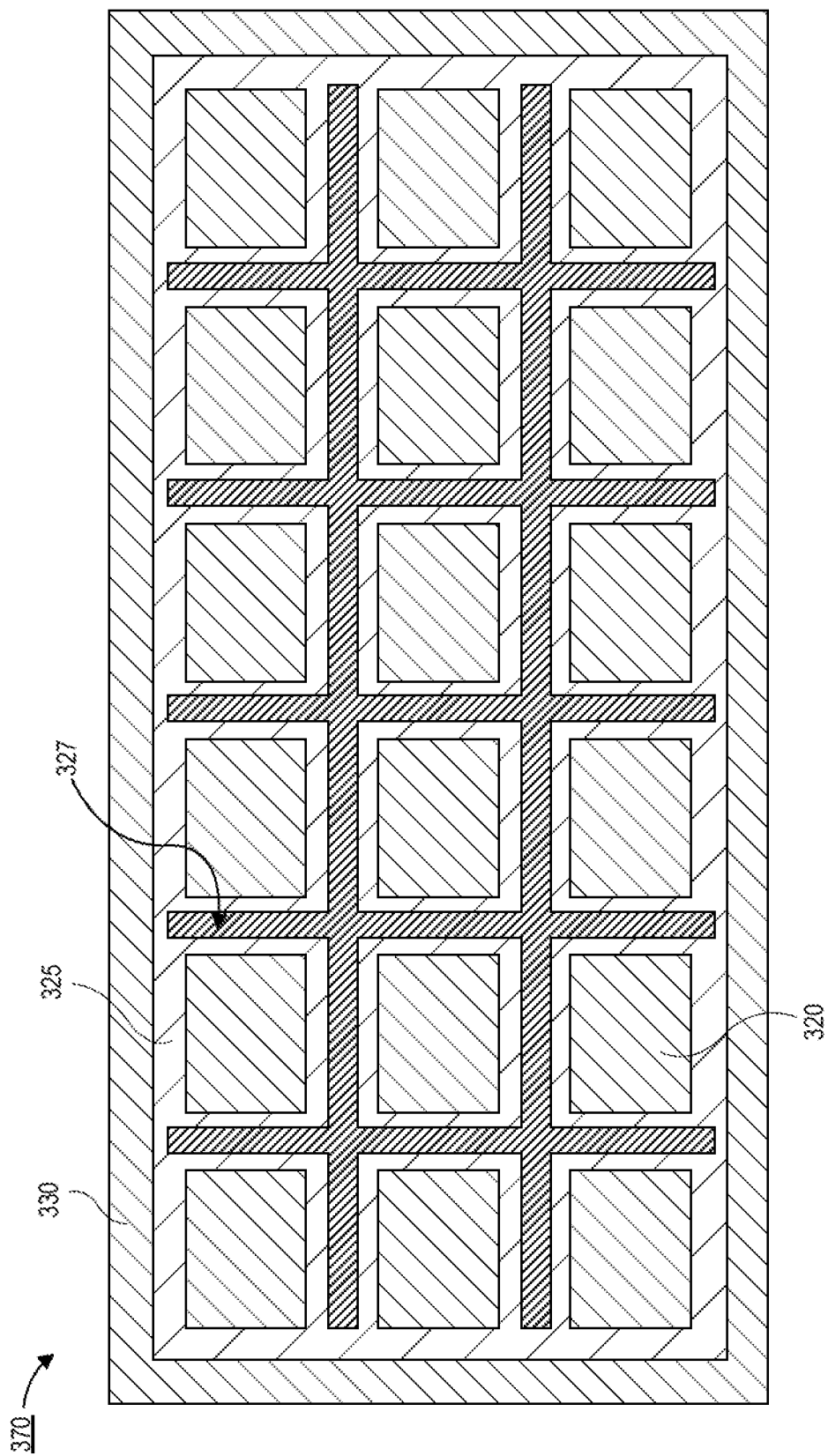
FIG. 3C is a plan view illustration of the wafer level assembly that more clearly illustrates the trenches surrounding perimeters of the plurality of dies, in accordance with an embodiment.

Referring now to FIG. 3C, a plan view illustration of the wafer level assembly 370 in FIG. 3B is shown, in accordance with an embodiment. As shown, a two dimensional array of dies 320 are disposed over the base substrate 330. While a substantially rectangular wafer level assembly 370 is shown in FIG. 3C, it is to be appreciated that the wafer level assembly 370 may also be substantially circular in shape (e.g., the shape of a silicon wafer).

In an embodiment, the trenches 327 encircle the perimeter of some or all of the dies 320. In FIG. 3C, the trenches 327 are shown with a different shading than that of the underfill 325 for clarity. However, it is to be appreciated that the trenches 327 may be entirely within the underfill 325 and, in actuality, there would be no discernable material difference between the underfill 325 and the bottom of the trenches 327. In an embodiment, the interior dies 320 (i.e., dies 320 that are bordered on all four sides by another die 320) include a trench 327 that entirely encircles the perimeter of the die 320. In an embodiment, the exterior dies 320 (i.e., dies 320 that are not bordered on all four sides by another die 320) may have trenches 327 along edges that are bordered by another die 320. However, in some embodiments, the exterior dies 320 may also be entirely encircled by a trench 327. Furthermore, in some embodiments, the interior dies 320 may have one or more edge that is not bordered by a trench 327.

Figure 3D:
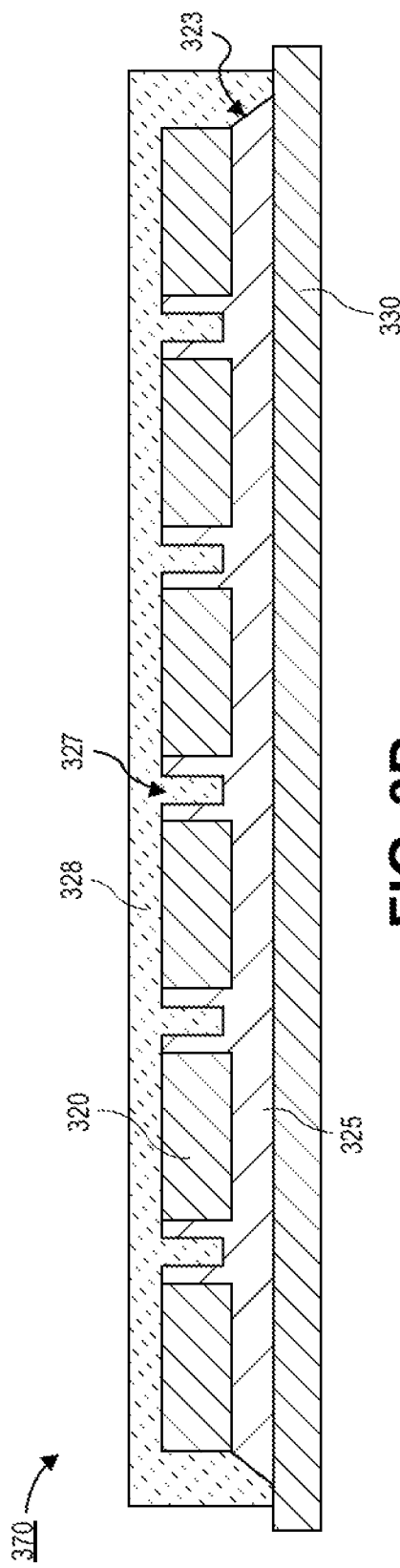
FIG. 3D is a cross-sectional illustration of the wafer level assembly after a mold layer is disposed over the plurality of dies, where the mold layer fills the trenches, in accordance with an embodiment.

Referring now to FIG. 3D, a cross-sectional illustration of a wafer level assembly 370 after a mold layer 328 is disposed over the plurality of dies 320 is shown, in accordance with an embodiment. In an embodiment, the mold layer 328 substantially fills the trenches 327. In an embodiment, the mold layer 328 may also be disposed over top surfaces of the plurality of dies 320. In an embodiment, the mold layer 328 may cover the fillets 323 and be disposed over a portion of a top surface of the base substrate 330.

Since the trenches 327 are substantially filled by the mold layer 328, the material properties between the plurality of the dies 320 is changed compared to the material properties of the underfill 325. Filling the trenches 327 with the mold layer 328 allows for the material properties between the dies 320 to be altered in order to provide reductions in warpage, improved reliability, and/or improved thermal performance.

In an embodiment, the mold layer 328 has a CTE that is lower than a CTE of the underfill 325. For example, the CTE of the underfill 325 may be approximately 30 ppm/K and the CTE of the mold layer 328 may be less than approximately 15 ppm/K. In an embodiment, the CTE of the mold layer 328 may be between approximately 5 ppm/K and 10 ppm/K. In an embodiment, the mold layer 328 may also include an elastic modulus that is lower than an elastic modulus of the underfill 325. For example, the elastic modulus of the mold layer 328 may be less than 15 GPa, or less than 10 GPa. In some embodiments, a thermal conductivity of the mold layer 328 may be greater than a thermal conductivity of the underfill 325. For example, the thermal conductivity of the mold layer 328 may be approximately 2 W/mK or greater, and the thermal conductivity of the underfill 325 may be approximately 1 W/mK or less. In a particular embodiment, the thermal conductivity of the mold layer 328 may be between approximately 2.5 W/mK and 3 W/mK.

Figure 3E:
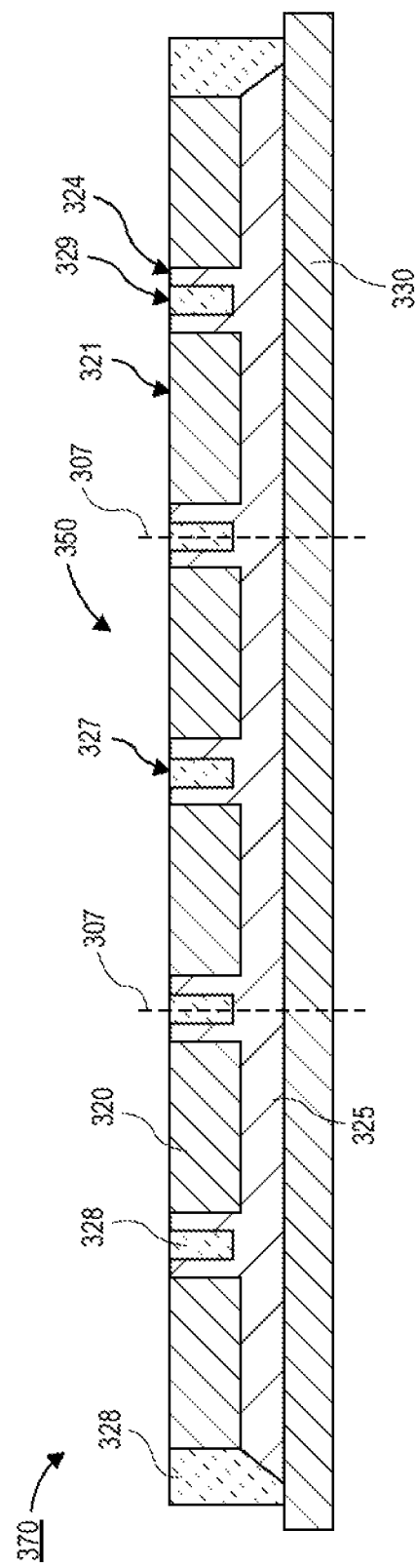
FIG. 3E is a cross-sectional illustration of the wafer level assembly after the mold layer is planarized, in accordance with an embodiment.

Referring now to FIG. 3E, a cross-sectional illustration of the wafer level assembly 370 after the mold layer 328 is recessed is shown, in accordance with an embodiment. In an embodiment, the mold layer 328 may be recessed with a polishing or grinding process (e.g., chemical mechanical polishing (CMP), a mechanical process, or the like). In an embodiment, recessing the mold layer 328 exposes the top surface 321 of the dies 320. Furthermore, the recessing process may result in top surfaces 329 of the mold layer 328, top surfaces 324 of the underfill 325, and top surfaces 321 of the dies 320 being substantially coplanar with each other.

In an embodiment, the wafer level assembly 370 may be singulated along lines 307 between the plurality of dies 320. In an embodiment, the singulation may result in the formation of composite dies 350 that comprise a portion of the base substrate 330 and a plurality of dies 320. In the illustrated embodiment, the composite dies 350 include two dies 320. However, it is to be appreciated that the composite dies 350 may each comprise any number of dies 320.

Figure 3F:
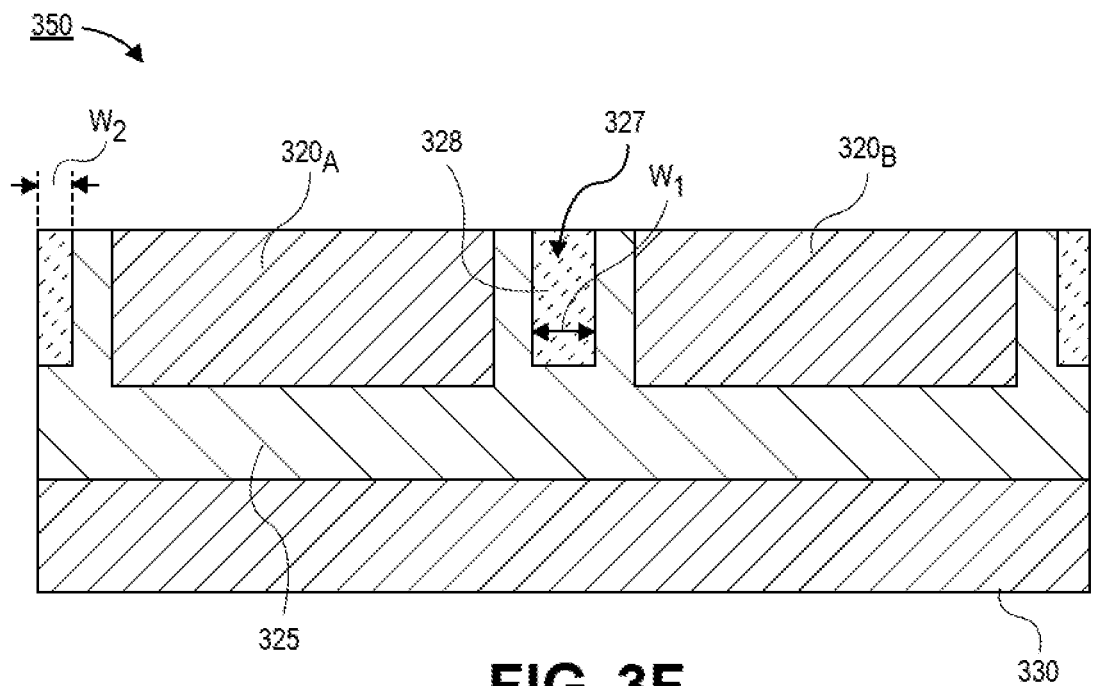
FIG. 3F is a cross-sectional illustration of a singulated composite die from the wafer level assembly, in accordance with an embodiment.

Referring now to FIG. 3F, a cross-sectional illustration of a composite die 350 after singulation is shown, in accordance with an embodiment. In an embodiment, the singulation may result in some of the trenches 327 being split since they are along the singulation lines 307. Accordingly, the width W of the mold layer 328 may not be uniform. For example, a first width $W_1$ of the mold layer 328 between dies $320_A$ and $320_B$ (which was not along a singulation line 307) may be larger than a second width $W_2$ of the mold layer 328 (which was along a singulation line 307). In some embodiments, the second width $W_2$ may be approximately half the first width $W_1$ or less.

Figure 3G:
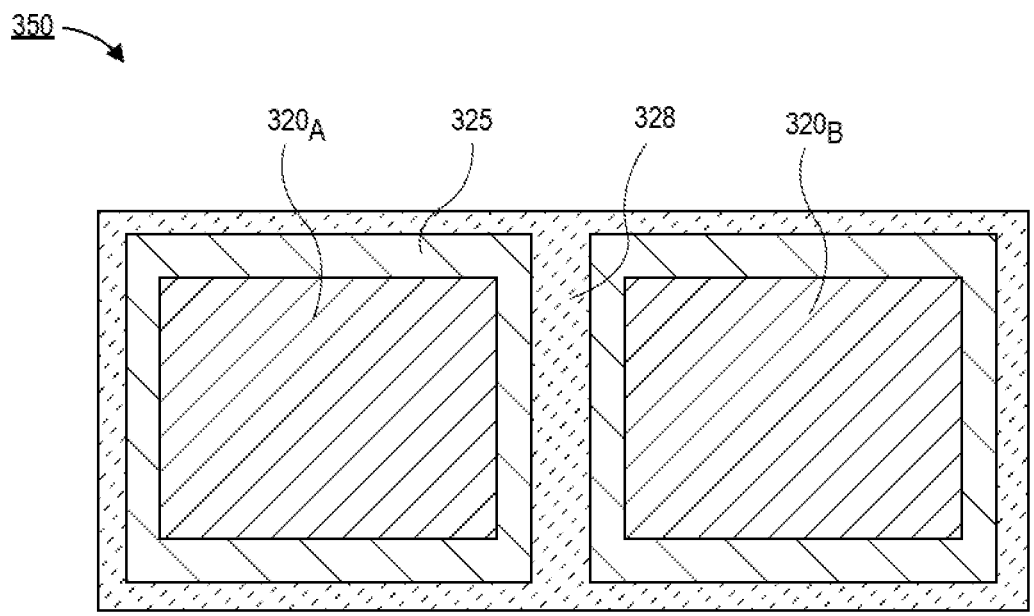
FIG. 3G is a plan view illustration of the composite die in FIG. 3F, in accordance with an embodiment.

Referring now to FIG. 3G, a plan view illustration of the composite die 350 in FIG. 3F is shown, in accordance with an embodiment. As shown, the composite die 350 comprises a pair of dies $320_A$ and $320_B$ that are each encircled by a portion of the underfill 325 and a portion of the mold layer 328. That is, the underfill 325 may directly contact the edges of the dies $320_A$ and $320_B$ and the mold layer 328 may be separated from the edges of the dies $320_A$ and $320_B$ by the portion of the underfill 325.

In FIGS. 3F and 3G, a composite die 350 that is taken from an interior of the wafer level assembly 370 is shown. It is to be appreciated that different cross-sections and plan views may be present when the composite die 350 is taken from the exterior of the wafer level assembly 370. For example, the trenches 327 may not entirely encircle the dies 320. Additionally, portions of the mold layer 328 may be in direct contact with an edge of the dies 320, (e.g., as shown in FIGS. 1A-1D).

Figure 4:
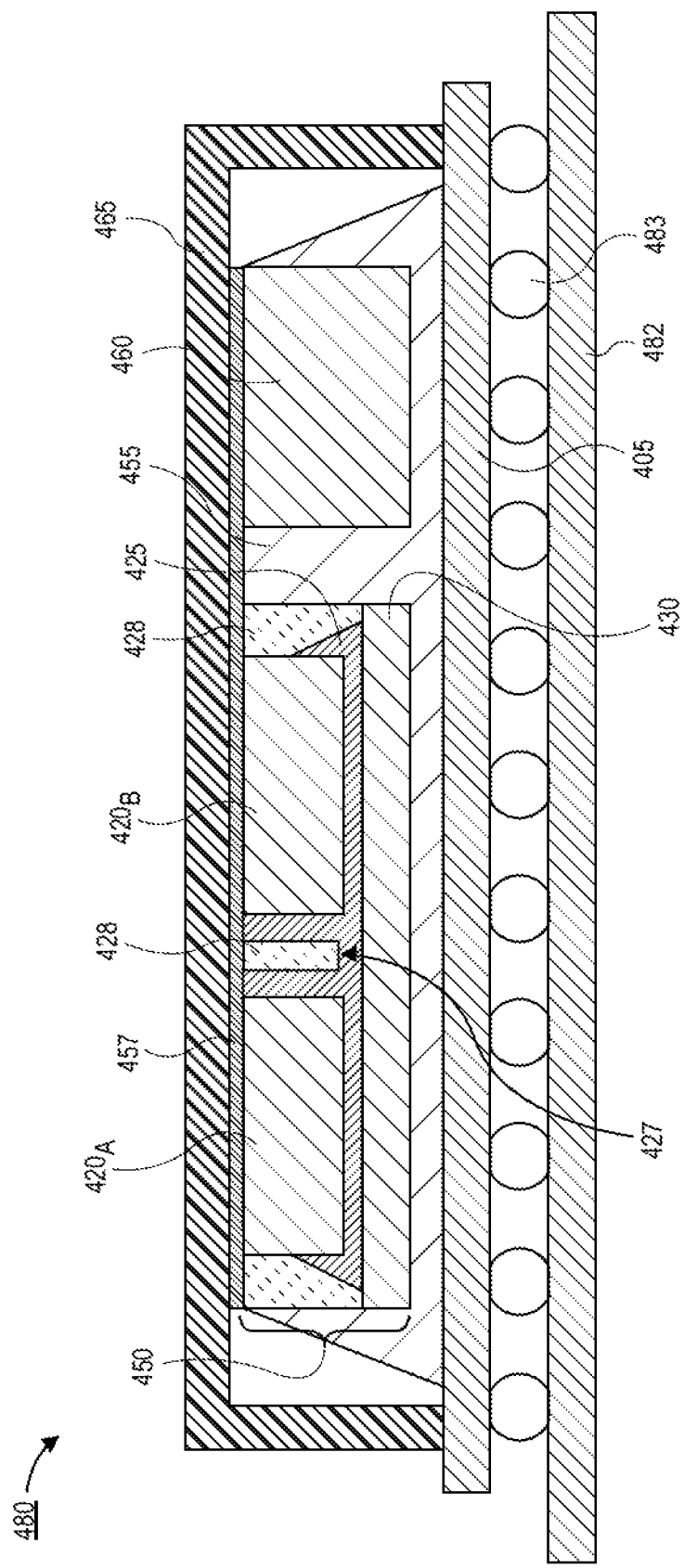
FIG. 4 is a cross-sectional illustration of an electronic system that comprises a composite die with a trench into the underfill between the first die and the second die, in accordance with an embodiment.

Referring now to FIG. 4, a cross-sectional illustration of an electronic system 480 is shown, in accordance with an embodiment. The electronic system 480 may comprise a board 482 (e.g., a motherboard or the like). In an embodiment, a package substrate 405 may be electrically coupled to the board 482 by interconnects 483. While solder bumps are illustrated as being the interconnects 483, it is to be appreciated that any suitable interconnect architecture (e.g., wire bonds, sockets, etc.) may be used to electrically couple the package substrate 405 to the board 482.

In an embodiment, a composite die 450 may be electrically coupled to the package substrate 405 by interconnects (not shown). The composite die 450 may be substantially similar to any of the composite dies described in accordance with embodiments disclosed herein. For example, the composite die 450 may comprise a base substrate 430, a plurality of dies 420, an underfill 425, and a mold layer 428. In an embodiment, a trench 427 into the underfill 425 between the dies 420 may be filled with a portion of the mold layer 428.

In an embodiment, a second die 460 (e.g., a companion die) may also be electrically coupled to the package substrate 405 by interconnects (not shown). In an embodiment, the composite die 450 and the second die 460 may be thermally coupled to an IHS 465 by a TIM 457. A second underfill 455 may also surround interconnects to the package substrate 405 and line portions of the edges of the composite die 450 and the second die 460.

Figure 5:
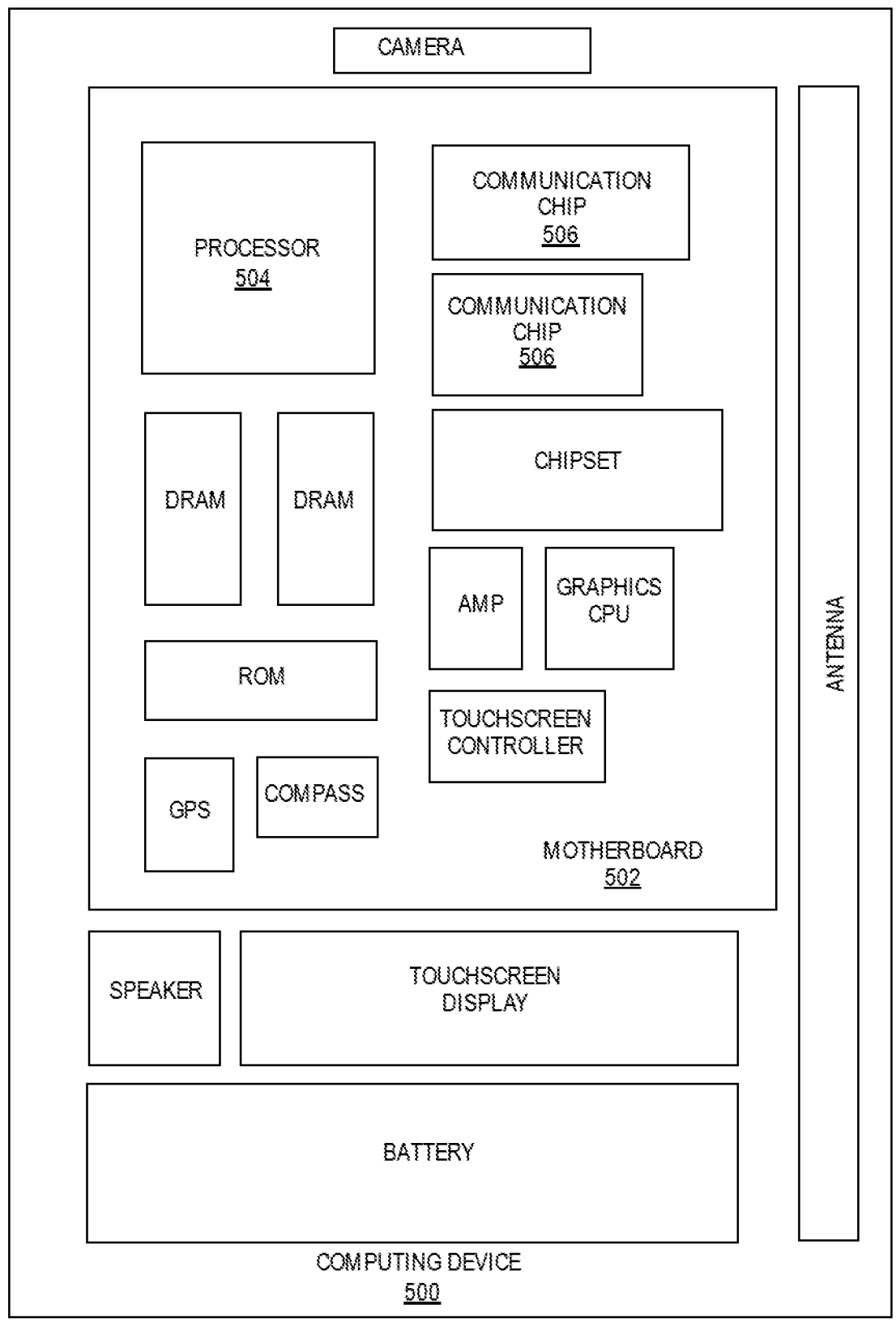
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be part of a composite die that comprises a trench in the underfill, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be part of a composite die that comprises a trench in the underfill, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a composite die, comprising: a base substrate; a first die over the base substrate; a second die over the base substrate and adjacent to the first die; an underfill layer between the first die and the base substrate, between the second die and the base substrate, and between the first die and the second die, and wherein a trench into the underfill layer is between the first die and the second die; and a mold layer over the first die and the second die, wherein the mold layer fills the trench.

Example 2: the composite die of Example 1, wherein a depth of the trench is less than a thickness of the first die and a thickness of the second die.

Example 3: the composite die of Example 1, wherein a depth of the trench is greater than a thickness of the first die and a thickness of the second die.

Example 4: the composite die of Example 3, wherein the trench passes entirely through the underfill layer.

Example 5: the composite die of Examples 1-4, wherein the trench has a tapered profile.

Example 6: the composite die of Examples 1-5, wherein a top surface of the underfill layer is substantially coplanar with a top surface of the first die and the second die.

Example 7: the composite die of Examples 1-6, wherein the base substrate is a passive substrate or an active substrate.

Example 8: the composite die of Examples 1-7, wherein the trench surrounds the first die and the second die.

Example 9: the composite die of Examples 1-9, wherein a coefficient of thermal expansion (CTE) of the mold layer is lower than the CTE of the underfill layer.

Example 10: the composite die of Example 9, wherein the CTE of the mold layer is less than approximately 10 parts per million per degree Celsius (ppm/C).

Example 11: the composite die of Examples 1-10, wherein a thermal conductivity of the mold layer is approximately 2.5 W/mK or greater.

Example 12: a method of forming a composite die, comprising: attaching a plurality of dies to a surface of a base substrate; disposing an underfill layer under and around the plurality of dies; forming a trench into the underfill layer, wherein the trench is between neighboring dies of the plurality of dies; disposing a mold layer over the plurality of dies, wherein the mold layer fills the trench; and singulating the plurality of dies into a plurality of composite dies.

Example 13: the method of Example 12, wherein each of the plurality of composite dies comprises: a first die; a second die; a portion of the base substrate; and a portion of the trench between the first die and the second die.

Example 14: the method of Example 12 or Example 13, wherein the trench is formed after curing the underfill layer.

Example 15: the method of Examples 12-14, wherein the trench is formed with a laser.

Example 16: the method of Example 15, wherein a profile of the trench is tapered.

Example 17: the method of Examples 12-16, further comprising:
planarizing the mold layer, wherein a top surface of the mold layer, top surfaces of the plurality of dies, and a top surface of the underfill layer are substantially coplanar with each other after the planarizing.

Example 18: the method of Examples 12-17, further comprising: assembling each of the plurality of composite dies into different ones of a plurality of electronic packages.

Example 19: the method of Examples 12-18, wherein the coefficient of thermal expansion (CTE) of the mold layer is lower than the CTE of the underfill layer.

Example 20: an electronic package, comprising: a package substrate; and a composite die electrically coupled to the package substrate, wherein the composite die comprises: a base substrate; a plurality of dies over the package substrate, wherein the plurality of dies are adjacent to each other; an underfill layer under and around the plurality of dies; and a trench into the underfill layer, wherein the trench is between a first die and a second die of the plurality of dies; and a mold layer over the plurality of dies, wherein the mold layer fills the trench.

Example 21: the electronic package of Example 20, further comprising: an integrated heat spreader (IHS) thermally coupled to the composite die by a thermal interface material (TIM) layer.

Example 22: the electronic package of Example 21, wherein a thermal path with the least thermal resistance from the base substrate to the IHS passes through the trench.

Example 23: the electronic package of Examples 20-22, further comprising: a third die attached to the package substrate.

Example 24: the electronic package of Examples 20-23, wherein the trench has a tapered profile.

Example 25: the electronic package of Examples 20-24, further comprising: a board, wherein the package substrate is electrically coupled to the board.

What is claimed is:

1. A composite die, comprising:
a base substrate;
a first die over the base substrate, the first die having a first sidewall laterally opposite a second sidewall;
a second die over the base substrate and adjacent to the first die, the second die having a first sidewall laterally opposite a second sidewall, wherein the first sidewall of the second die faces the second sidewall of the first die;
an underfill layer between the first die and the base substrate, between the second die and the base substrate, and between the first die and the second die, and wherein a trench into the underfill layer is between the first die and the second die; and
a mold layer in contact with the first sidewall of the first die and in contact with the second sidewall of the second die, wherein the mold layer fills the trench.

2. The composite die of claim 1, wherein a depth of the trench is less than a thickness of the first die and a thickness of the second die.

3. The composite die of claim 1, wherein a depth of the trench is greater than a thickness of the first die and a thickness of the second die.

4. The composite die of claim 3, wherein the trench passes entirely through the underfill layer.

5. The composite die of claim 1, wherein the trench has a tapered profile.

6. The composite die of claim 1, wherein a top surface of the underfill layer is substantially coplanar with a top surface of the first die and the second die.

7. The composite die of claim 1, wherein the base substrate is a passive substrate or an active substrate.

8. The composite die of claim 1, wherein the trench surrounds the first die and the second die.

9. The composite die of claim 1, wherein a coefficient of thermal expansion (CTE) of the mold layer is lower than the CTE of the underfill layer.

10. The composite die of claim 9, wherein the CTE of the mold layer is less than approximately 10 parts per million per degree Celsius (ppm/C).

11. The composite die of claim 1, wherein a thermal conductivity of the mold layer is approximately 2.5 W/mK or greater.

12. A method of forming a composite die, comprising:
attaching a plurality of dies to a surface of a base substrate, the plurality of dies comprising pairs of neighboring dies, each pair of neighboring dies comprising a first die having a first sidewall laterally opposite a second sidewall, and a second die having a first sidewall laterally opposite a second sidewall, wherein the first sidewall of the second die faces the second sidewall of the first die;
disposing an underfill layer under and around the plurality of dies;
forming a trench into the underfill layer, wherein the trench is between neighboring dies of the plurality of dies;
disposing a mold layer on the plurality of dies, the mold layer in contact with the first sidewall of the first die and in contact with the second sidewall of the second die of each pair of neighboring dies, wherein the mold layer fills the trench; and
singulating the plurality of dies into a plurality of composite dies.

13. The method of claim 12, wherein each of the plurality of composite dies comprises:
the first die;
the second die;
a portion of the base substrate; and
a portion of the trench between the first die and the second die.

14. The method of claim 12, wherein the trench is formed after curing the underfill layer.

15. The method of claim 12, wherein the trench is formed with a laser.

16. The method of claim 15, wherein a profile of the trench is tapered.

17. The method of claim 12, further comprising:
planarizing the mold layer, wherein a top surface of the mold layer, top surfaces of the plurality of dies, and a top surface of the underfill layer are substantially coplanar with each other after the planarizing.

18. The method of claim 12, further comprising:
assembling each of the plurality of composite dies into different ones of a plurality of electronic packages.

19. The method of claim 12, wherein the coefficient of thermal expansion (CTE) of the mold layer is lower than the CTE of the underfill layer.

20. An electronic package, comprising:
a package substrate; and
a composite die electrically coupled to the package substrate, wherein the composite die comprises:
a base substrate;
a plurality of dies over the package substrate, wherein the plurality of dies comprises a first die having a first sidewall laterally opposite a second sidewall, and a second die having a first sidewall laterally opposite a second sidewall, wherein the first sidewall of the second die faces the second sidewall of the first die;
an underfill layer under and around the plurality of dies; and
a trench into the underfill layer, wherein the trench is between a first die and a second die of the plurality of dies; and
a mold layer on the plurality of dies, the mold layer in contact with the first sidewall of the first die and in contact with the second sidewall of the second die, wherein the mold layer fills the trench.

21. The electronic package of claim 20, further comprising:
an integrated heat spreader (IHS) thermally coupled to the composite die by a thermal interface material (TIM) layer.

22. The electronic package of claim 21, wherein a thermal path with the least thermal resistance from the base substrate to the IHS passes through the trench.

23. The electronic package of claim 20, further comprising:
a third die attached to the package substrate.

24. The electronic package of claim 20, wherein the trench has a tapered profile.

25. The electronic package of claim 20, further comprising:
a board, wherein the package substrate is electrically coupled to the board.

26. A composite die, comprising:
a base substrate;
a first die over the base substrate;
a second die over the base substrate and adjacent to the first die;
an underfill layer between the first die and the base substrate, between the second die and the base substrate, and between the first die and the second die, wherein a trench into the underfill layer is between the first die and the second die, and wherein the trench has a tapered profile; and
a mold layer over the first die and the second die, wherein the mold layer fills the trench.

27. A composite die, comprising:
a base substrate;
a first die over the base substrate;
a second die over the base substrate and adjacent to the first die;
an underfill layer between the first die and the base substrate, between the second die and the base substrate, and between the first die and the second die, and wherein a trench into the underfill layer is between the first die and the second die; and
a mold layer over the first die and the second die, wherein the mold layer fills the trench, wherein a coefficient of thermal expansion (CTE) of the mold layer is lower than the CTE of the underfill layer.

* * * * *